(12) United States Patent
Flachowsky et al.

(10) Patent No.: US 8,574,981 B2
(45) Date of Patent: Nov. 5, 2013

(54) METHOD OF INCREASING THE GERMANIUM CONCENTRATION IN A SILICON-GERMANIUM LAYER AND SEMICONDUCTOR DEVICE COMPRISING SAME

(75) Inventors: Stefan Flachowsky, Dresden (DE); Thilo Scheiper, Dresden (DE); Peter Javorka, Radeburg (DE); Jan Hoentschel, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 13 days.

(21) Appl. No.: 13/101,659

(22) Filed: May 5, 2011

(65) Prior Publication Data

US 2012/0280289 A1 Nov. 8, 2012

(51) Int. Cl.
*H01L 21/02* (2006.01)

(52) U.S. Cl.
USPC ............. 438/233; 257/E21.438; 257/E29.116

(58) Field of Classification Search
USPC ........... 257/616, E21.438, E29.116, E29.242; 438/233
See application file for complete search history.

(56) References Cited

U.S. PATENT DOCUMENTS

| | | | |
|---|---|---|---|
| 6,917,096 B2* | 7/2005 | Sugiyama et al. | 257/616 |
| 2005/0260809 A1* | 11/2005 | Tezuka et al. | 438/199 |
| 2008/0001171 A1* | 1/2008 | Tezuka et al. | 257/191 |
| 2008/0079086 A1* | 4/2008 | Jung et al. | 257/369 |
| 2009/0294801 A1* | 12/2009 | Harley et al. | 257/192 |
| 2011/0024804 A1* | 2/2011 | Chang et al. | 257/288 |

FOREIGN PATENT DOCUMENTS

WO 2005088721 * 9/2005

OTHER PUBLICATIONS

Shimura et al., "Oxidation Saturation of SiGe Alloy on Silicon-on-insulator Wafers," ECS Transactions, 3:1033-37, 2006.
Spadafora et al., "Oxidation rate enhancement of SiGe epitaxial films oxidized in dry ambient," Applied Physics Letters, 83:3713-15, 2003.
Sugiyama et al., "Ge Condensation on Technologies for Advanced MOSFETs on SGOI and GOI Substrates," ECS Transactions, 3:1015-22, 2006.

* cited by examiner

*Primary Examiner* — Caridad Everhart
(74) *Attorney, Agent, or Firm* — Williams, Morgan & Amerson, P.C.

(57) ABSTRACT

Disclosed herein is a method of forming a semiconductor device. In one example, the method comprises forming layer of silicon germanium on a P-active region of a semiconducting substrate wherein the layer of silicon germanium has a first concentration of germanium, and performing an oxidation process on the layer of silicon germanium to increase a concentration of germanium in at least a portion of the layer of silicon germanium to a second concentration that is greater than the first concentration of germanium.

18 Claims, 3 Drawing Sheets

METHOD OF INCREASING THE GERMANIUM CONCENTRATION IN A SILICON-GERMANIUM LAYER AND SEMICONDUCTOR DEVICE COMPRISING SAME

BACKGROUND OF THE INVENTION

1. Field of the Invention

Generally, the present disclosure generally relates to the manufacturing of sophisticated semiconductor devices, and, more specifically, to a method of increasing the germanium concentration in a silicon germanium layer of a semiconductor device and the resulting device containing such a layer with the increased germanium concentration.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NFETs) and/or P-channel transistors (PFETs), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends upon a variety of factors, such as the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on, among other things, the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include so-called high-k materials (k value greater than 10) that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode to replace the typical polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and, thus, the threshold voltages in a very advanced process stage.

FIG. 1 depicts an illustrative prior art device 100 that is generally comprised of a partially formed NFET transistor 100N and a partially formed PFET transistor 100P formed in and above a semiconducting substrate 10. The illustrative transistors 100N, 100p are separated by an illustrative isolation structure 12, e.g., a shallow trench isolation structure, formed in the substrate 10. In one illustrative embodiment, the semiconducting substrate 10 is comprised of silicon. The substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration.

At the stage of manufacture depicted in FIG. 1, the transistors 100N, 100P are each comprised of a gate structure 20 and source/drain regions 30. The gate structure 20 may include a gate insulation layer 22, a high-k insulation layer 24, a gate electrode 26 and sidewall spacers 28. The gate electrode 26 may be made of one or more layers of a variety of conductive materials, such as aluminum (for the NFET transistor 100N) and lanthanum (for the PFET transistor 100P). In some cases, the PFET transistor 100P may have an additional work function layer 25, such as titanium nitride, that may not be present in the NFET transistor 100N. Typically, during the formation of the PFET transistor 100P, a layer of semiconductor material 32, e.g., silicon germanium, is selectively formed on the active layer 10C in the P-active region where the PFET transistor 100P will be formed to enhance the performance of the PFET transistor 100P. Typically, such a layer of semiconductor material 32 is not formed for the NFET transistor 100N. Prior to selectively forming the layer of semiconductor material 32 for the PFET transistors 100P, one or more etching and masking process may be performed such that only the portions of the active layer 10C where PFET transistors 100P will be formed are exposes to the selective deposition process, e.g., a selective epitaxial deposition process. Additionally, although not depicted in FIG. 1, the layer of material that make gate electrode structure may not be the same for the PFET and NFET transistors, 100P, 100N, respectively. That is, in one example, the PFET transistor 100P may have additional work function adjusting materials as compared to the materials used for the NFET transistor 100N. The thickness of the layers of materials may vary as well for the NFET and PFET transistors 100N, 100P, even if the same material is employed.

There is a constant demand for integrated circuit devices with increased performance capabilities. As noted above, given that the gate length on modern transistor devices is 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NFET transistors and create a compressive stress in the channel region for PFET transistors). As it relates to the use of work function metals in the gate electrode structure of a PFET transistor, in general, the less the amount of the work function metal, the greater the performance, e.g., switching speed, of the resulting device. However, by decreasing the amount of the work function material, the threshold voltage of the resulting PFET device tends to increase, which tends to reduce the switching speed of the resulting device. Another possible technique for possibly increasing the performance of a PFET transistor, is to increase the germanium concentration of in the layer of silicon germanium 32 discussed above. However, based upon the experience of the inventors, current epitaxial silicon deposition techniques and equipment are limited to forming acceptable silicon germanium layers have a germanium concentration ranging from approximately 23-30%. Efforts to increase the germanium concentration in the resulting layer of silicon germanium using current epitaxial silicon deposition techniques and equipment results in layers that exhibit crystalline defects, e.g., stacking faults, that render such defective silicon germanium layers ineffective for use in modern semiconductor devices.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed the manufacturing of sophisticated semiconductor devices, and, more specifically, to a method of increasing the germanium concentration in a silicon germanium layer of a semiconductor device and the resulting device containing such a layer with the increased germanium concentration. In one example, the method comprises forming layer of silicon germanium on a P-active region of a semiconducting substrate wherein the layer of silicon germanium has a first concentration of germanium, and performing an oxidation process on the layer of silicon germanium to increase a concentration of germanium in at least a portion of the layer of silicon germanium to a second concentration that is greater than the first concentration of germanium.

A further illustrative method disclosed herein comprises forming a layer of silicon germanium on a P-active region of a semiconducting substrate wherein the layer of silicon germanium has a first concentration of germanium, performing an oxidation process on the layer of silicon germanium to form a layer of silicon dioxide on the layer of silicon germanium to increase a concentration of germanium in at least a portion of the layer of silicon germanium to a second concentration that is greater than the said first concentration of germanium, and removing the layer of silicon dioxide.

BRIEF DESCRIPTION OF THE DRAWINGS

The disclosure may be understood by reference to the following description taken in conjunction with the accompanying drawings, in which like reference numerals identify like elements, and in which:

FIGS. 2A-2I depict one illustrative example of the novel process flow described herein.

Figure 1:
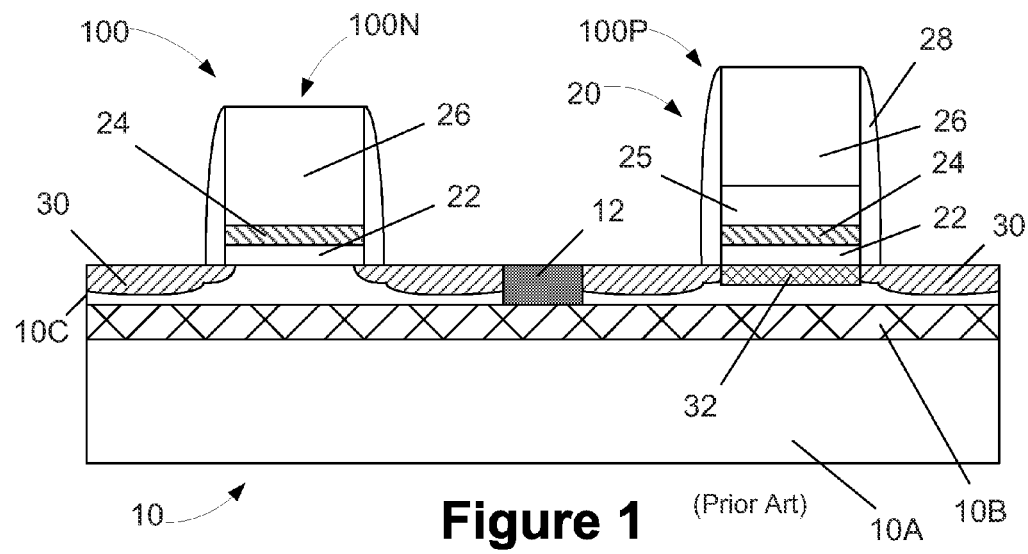
FIG. 1 schematically depicts an illustrative prior art semiconductor device that includes illustrative NFET and PFET transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to techniques that may be employed in forming sophisticated gate electrode structures for various integrated circuit devices while reducing or perhaps eliminating across-wafer height differences between NFET and PFET transistors. The illustrative process flow described herein may also reduce variations in the threshold voltages of the NFET and PFET transistors. In some cases, the transistors may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 2A-2I, further illustrative embodiments will now be described in more detail, wherein reference may also be made to FIG. 1, if required.

Figure 2A:
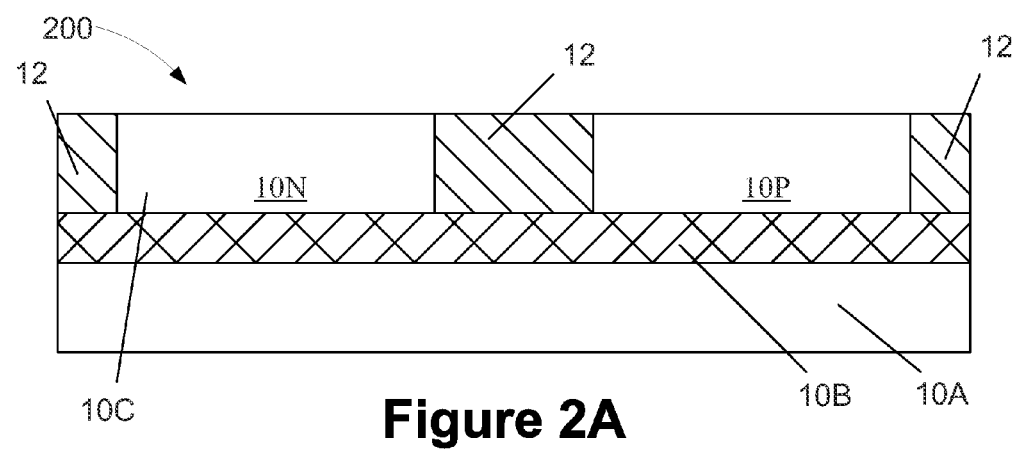

FIG. 2A depicts an illustrative device 200 that is generally comprised of an N-active region 10N, where an illustrative NFET transistor will ultimately be formed, and a P-active region 10P, where an illustrative PFET transistor will ultimately be formed. The NFET and PFET transistors will be formed in and above the active layer 10C of the semiconducting substrate 10. The illustrative active regions 10N, 10P are separated by an illustrative isolation structure 12, e.g., a shallow trench isolation structure, formed in the substrate 10. In one illustrative embodiment, the semiconducting substrate 10 a silicon-on-insulator (SOI) substrate comprised of bulk silicon 10A, a buried insulation layer 10B (commonly referred to as a "BOX" layer 10B and an active layer 10C, which may also be a silicon material. Of course, the present invention is equally applicable to other configurations of the substrate 10. For example, the substrate 10 may be comprised of semiconducting materials other than silicon and/or it may be in another form, such as a bulk silicon configuration. Thus, the terms substrate or semiconductor substrate should be understood to cover all semiconductor structures.

At the stage of manufacture depicted in FIG. 2A, the N-active region 10N and the P-active region 10P have been defined by the formation of illustrative shallow trench isolation structures 12 in the active layer 10C of the substrate 10. The substrate 10 itself, and the isolation structures 12 may be formed using traditional techniques. For example, the isolation structures 12 may be formed by performing one or more etching and deposition processes, which are well known to those skilled in the art.

Figure 2B:
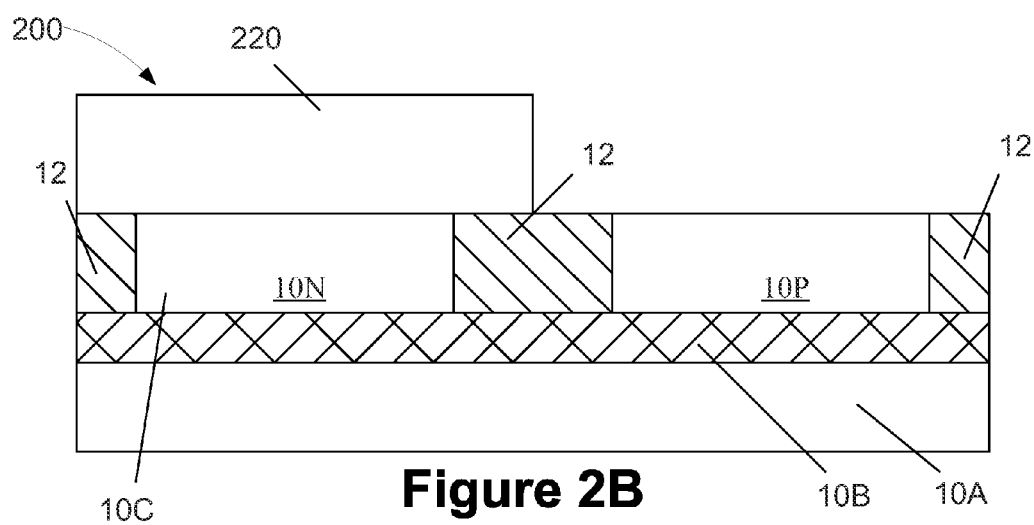

Next, as shown in FIG. 2B, a masking layer 220 is formed over the N-active regions 10N across the substrate 10. The masking layer 220 may be comprised of a variety of materials, e.g., photoresist. The masking layer 220 may be formed by a variety of techniques, e.g., spin-coating, etc. In one illustrative embodiment, the masking layer 20 is a layer of photoresist that is formed using traditional photolithography techniques, e.g., spin-on coating, soft-bake, exposure, hard bake and develop, etc.

Next, as shown in FIG. 2C a layer of silicon germanium 222 is formed on the P-active region 10P. Prior to forming the layer of silicon germanium 222, a pre-clean process may be performed to remove materials such as native oxides from the surface of the P-active region 10P. The pre-clean process may be performed using, for example, a HF in either a wet or dry etching process. The layer of silicon germanium 222 may be formed by a variety of techniques, e.g., by performing an epitaxial growth process in an deposition chamber using current day epitaxial deposition tools and techniques, etc. In one illustrative embodiment, the layer of silicon germanium 222 may have an as-deposited thickness of approximately 20-30 nm, and it may have germanium concentration ranging from approximately 23-30% germanium as originally formed.

Next, as shown in FIG. 2D, the device 200 is exposed to an oxidizing ambient 224 comprised of, in one illustrative example, pure dry oxygen to form a layer of silicon dioxide 226 on the layer of silicon germanium 222. The duration of the exposure to the oxidizing ambient and conditions of the oxidation process may vary depending upon a variety of factors such as the final desired configuration of the device 200. In one illustrative example, the oxidation process may be performed in any acceptable process tool, e.g., a furnace, at a temperature ranging from 800-1200° C. for a duration of approximately 30-120 minutes. In one particularly illustrative example, the oxidation process may be performed at a temperature of approximately 1000° C. for a duration of approximately 60 minutes. In one illustrative example, the layer of silicon dioxide may have a thickness ranging from approximately 30-40 nm. The oxidation process effectively reduces the amount of silicon in the original layer of silicon germanium 222 because silicon is preferred over germanium in the oxidation process. The oxidation process and the formation of the layer of silicon dioxide 226 results in the formation of a layer of silicon germanium 222C having an increased concentration of germanium as compared to the germanium concentration in the layer of silicon germanium 222 as it was originally formed in the epitaxial deposition process. For example, whereas the original layer of silicon germanium 222 may have had a germanium concentration of approximately 23-30%, after the oxidation process, the resulting layer of silicon germanium 222C may have a concentration ranging from 40-90%. Theoretically, using the techniques disclosed herein, the germanium concentration in the resulting layer of silicon germanium 222C may be on the order of approximately 100%. It should also be noted that, as a result of the formation of the layer of silicon dioxide 226, some of the original thickness of the original layer of silicon germanium 222 will be reduced. In one illustrative example, where the original layer of silicon germanium 222 has a thickness of approximately 20-30 nm, the final layer of silicon germanium 222C may have a thickness ranging from approximately 5-10 nm, depending upon the parameters and duration of the oxidation process.

Additionally, the concentration of germanium in the resulting layer of silicon germanium 222C may not be uniform throughout its thickness. That is, the concentration of germanium in the resulting layer of silicon germanium 222C may be higher near the upper oxidized surface 222U than at the bottom surface 222B of the resulting layer of silicon germanium 222C. The exact distribution of germanium in the resulting layer of silicon germanium 222C may vary depending upon the particular details of the oxidation process. In one example, the increased concentration of germanium penetrates into the resulting layer of silicon germanium 222C for at least a distance of 20-60 nm from the oxidized surface 222U. However, it should be understood that when it is stated that the layer of silicon germanium 222C has an increased concentration of germanium as compared to the germanium concentration in the original layer of silicon germanium 222 as it was originally formed in the epitaxial deposition process, that such increased concentration may be at any point throughout the thickness of the final layer of silicon germanium 222C.

Figure 2F:
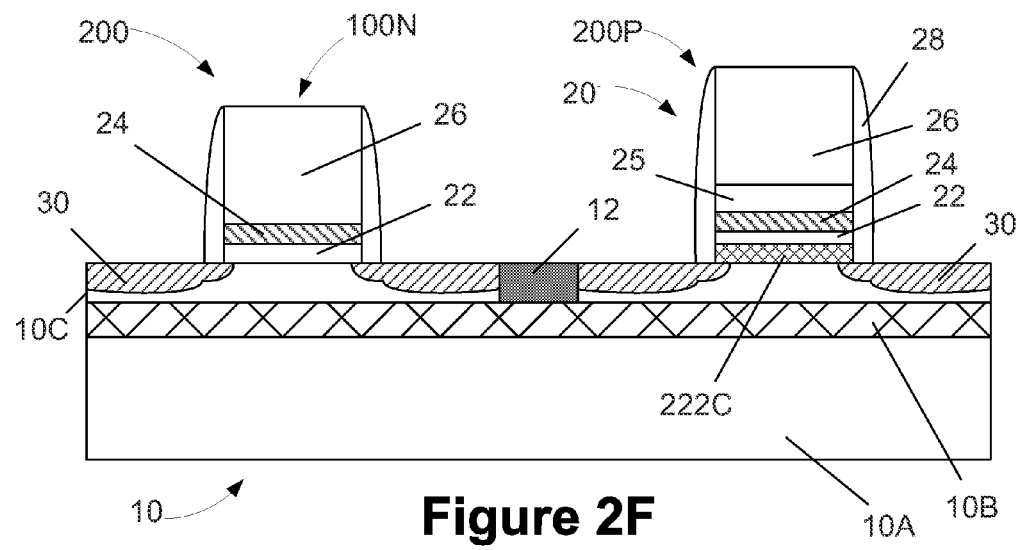

Thereafter, as shown in FIG. 2E, the layer of silicon dioxide 226 may be removed at some later point in processing by performing an etching process. The masking layer 220 may also be removed at some point in processing after the layer of silicon germanium 222C is formed. At the point depicted in FIG. 2E, the device 200 may be subjected to additional processing to complete the formation of the desired semiconductor devices. For example, as shown in FIG. 2F, a novel PFET transistor 200P may be formed that is comprised of the final layer of silicon germanium 222C having the increased germanium concentration as described herein.

Figure 2G:
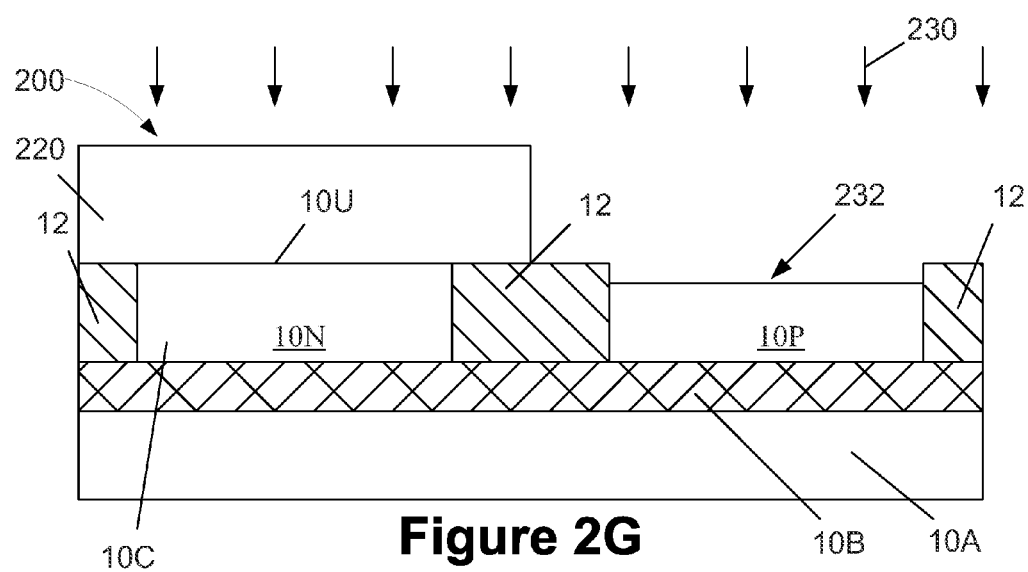
Figure 2H:
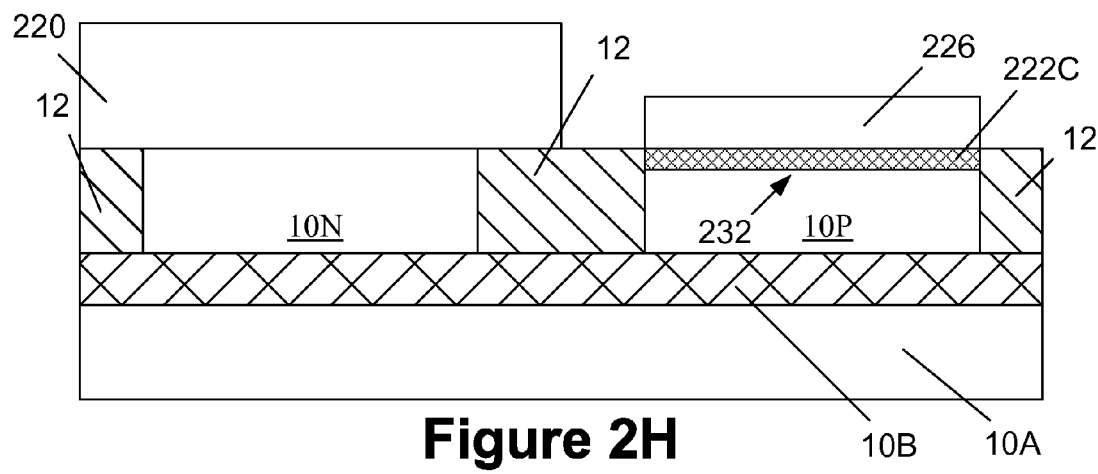
Figure 2I:
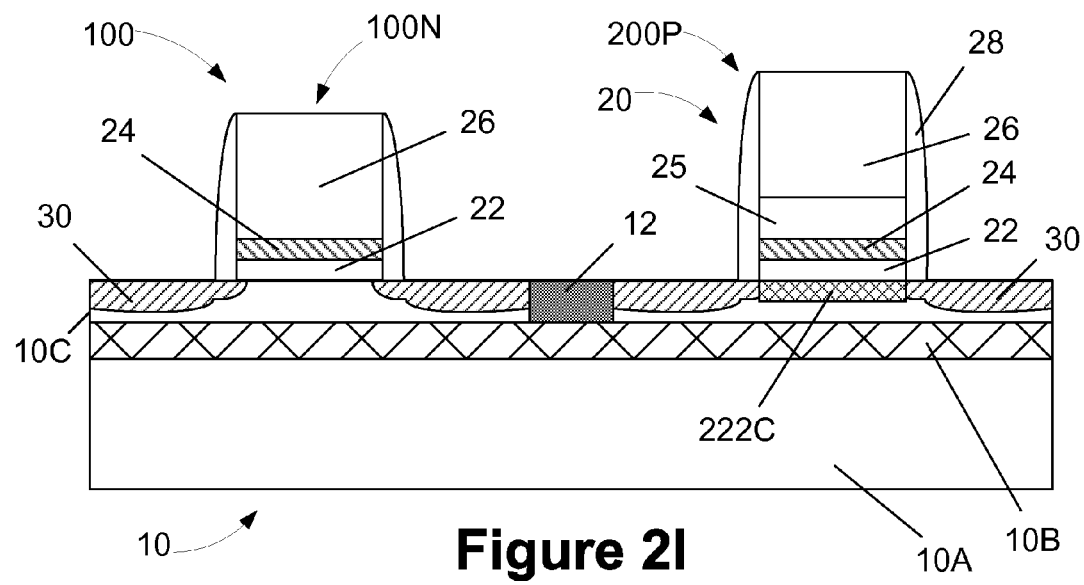

In another illustrative embodiment, as shown in FIG. 2G, an etching process 230 may be selectively performed on the P-active region 10P to form a recess 232 in the P-active region 10P prior to the formation of the original layer of silicon germanium 222. The type of etching process 230 performed, e.g., wet or dry, the etchant(s) used, and the parameters of the etching process 230 may vary depending upon a variety of factors such as the material of the P-active region 10P and the nature of the device under construction. The depth of the recess 232 may be selected such that, when the device is completed, the upper oxidized surface 222U is approximately level with the surface 10U of the N-active region 10N. Thereafter, as shown in FIG. 2H, the layer of silicon germanium 222C with increased germanium concentration is formed in and above the recess 232 using the techniques previously described. That is, an oxidation process is performed to form the silicon dioxide layer 226 to thereby result in the layer of silicon germanium 222C having a higher concentration of germanium than the originally formed layer of silicon germanium (which is not shown in FIG. 2H). FIG. 2I depicts another embodiment of a novel PFET transistor 200P comprised of the final layer of silicon germanium 222C having the increased germanium concentration as described herein, wherein the P-active region 10P was recessed prior to the formation of the original layer of silicon germanium as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
    forming layer of silicon germanium on a P-active region of a semiconducting substrate, said layer of silicon germanium having a first concentration of germanium;
    performing an oxidation process on an exposed upper surface of said layer of silicon germanium to increase a concentration of germanium in at least a portion of said layer of silicon germanium to a second concentration that is greater than said first concentration; and forming a gate structure of a PFET transistor above said layer of silicon germanium, said gate structure comprising a gate insulation layer, wherein said at least said portion of said layer of silicon germanium having said second concentration of germanium is positioned at an interface between said gate insulation layer and a channel region of the PFET transistor.

2. The method of claim 1, wherein, prior to forming said layer of silicon germanium, forming a recess in said P-active region and thereafter forming said layer of silicon germanium in and above said recess.

3. The method of claim 1, wherein said second concentration of germanium is at least 40%.

4. The method of claim 1, wherein said second concentration of germanium ranges from 40-90%.

5. The method of claim 1, wherein forming said layer of silicon germanium comprises performing an epitaxial deposition process to form said layer of silicon germanium, and wherein said first concentration of germanium ranges from 23-30%.

6. The method of claim 1, wherein, after said oxidation process is performed, said second concentration of germanium is not uniformly distributed within said layer of silicon germanium.

7. The method of claim 1, wherein performing said oxidation process comprises performing said oxidation process in a dry oxygen ambient.

8. The method of claim 7, wherein said oxidation process is performed at a temperature that ranges from 800-1200° C.

9. The method of claim 8, wherein said oxidation process is performed for a duration of that ranges from 30-120 minutes.

10. The method of claim 1, wherein performing said oxidation process results in the formation of a layer of silicon dioxide on said layer of silicon germanium.

11. The method of claim 10, wherein the formation of said layer of silicon dioxide consumes at least a portion of an original thickness of said layer of silicon germanium.

12. A method, comprising:
forming a layer of silicon germanium on a P-active region of a semiconducting substrate, said layer of silicon germanium having a first concentration of germanium;
performing an oxidation process on an exposed upper surface of said layer of silicon germanium to form a layer of silicon dioxide on said layer of silicon germanium to increase a concentration of germanium in at least a portion of said layer of silicon germanium to a second concentration that is greater than said first concentration;
removing said layer of silicon dioxide; and
forming a gate structure of a PFET transistor above said layer of silicon germanium, said gate structure comprising a gate insulation layer, wherein said at least said portion of said layer of silicon germanium having said second concentration of germanium is positioned at an interface between said gate insulation layer and a channel region of the PFET transistor.

13. The method of claim 12, wherein performing said oxidation process comprises performing said oxidation process in a dry oxygen ambient.

14. The method of claim 12, wherein said second concentration of germanium is at least 40%.

15. The method of claim 12, wherein said second concentration of germanium ranges from 40-90%.

16. The method of claim 12, wherein forming said layer of silicon germanium comprises performing an epitaxial deposition process to form said layer of silicon germanium, and wherein said first concentration of germanium ranges from 23-30%.

17. The method of claim 12, wherein removing said layer of silicon dioxide comprises performing at least one etching process.

18. The method of claim 12, wherein, prior to forming said layer of silicon germanium, forming a recess in said P-active region and thereafter forming said layer of silicon germanium in and above said recess.

* * * * *